US010867897B2

(12) United States Patent
Chang et al.

(10) Patent No.: US 10,867,897 B2
(45) Date of Patent: Dec. 15, 2020

(54) POP DEVICE

(71) Applicant: Taiwan Semiconductor Manufacturing Company, Ltd., Hsinchu (TW)

(72) Inventors: Chin-Chuan Chang, Zhudong Township (TW); Jing-Cheng Lin, Zhudong Township (TW); Nai-Wei Liu, Fengshan (TW); Wan-Ting Shih, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 15/952,529

(22) Filed: Apr. 13, 2018

(65) Prior Publication Data

US 2018/0233441 A1   Aug. 16, 2018

Related U.S. Application Data

(62) Division of application No. 13/753,204, filed on Jan. 29, 2013, now Pat. No. 9,953,907.

(51) Int. Cl.
*H01L 23/498* (2006.01)
*H01L 21/56* (2006.01)
(Continued)

(52) U.S. Cl.
CPC ........ *H01L 23/49816* (2013.01); *H01L 21/50* (2013.01); *H01L 21/568* (2013.01);
(Continued)

(58) Field of Classification Search
CPC ..... H01L 25/50; H01L 25/043; H01L 25/074; H01L 25/0756; H01L 25/0657
See application file for complete search history.

(56) References Cited

U.S. PATENT DOCUMENTS 5,841,193 A   11/1998   Eichelberger
6,034,441 A   3/2000   Chen
(Continued)

FOREIGN PATENT DOCUMENTS

TW   200532880 A   10/2005
TW   201007924 A   2/2010
(Continued)

OTHER PUBLICATIONS

Microstructures Lab, "Wet-Etching", Electrical Computer & Engineering: University of Colorado Boulder, Jan. 24, 2011, 7 pages.
(Continued)

*Primary Examiner* — David A Zarneke
(74) *Attorney, Agent, or Firm* — Slater Matsil, LLP (57) ABSTRACT

A method of forming a PoP device comprises placing an adhesive layer on a carrier substrate, coupling a plurality of chip packages to the adhesive layer on the carrier substrate, placing a bonding layer on the chip packages, and coupling a plurality of chips to the bonding layer on the chip packages. The method further comprises injecting a molding compound to encapsulate the chip packages and the chips on the carrier substrate, grinding the molding compound to expose a plurality of connecting elements of the chips and a plurality of second connecting elements of the chip packages, forming a redistribution layer (RDL) on the molding compound and the exposed connecting elements and second connecting elements, forming a ball grid array (BGA) on the RDL, and de-bonding the carrier substrate.

21 Claims, 5 Drawing Sheets

(51) Int. Cl.

| | | |
|---|---|---|
| *H01L 23/00* | (2006.01) | |
| *H01L 25/03* | (2006.01) | |
| *H01L 25/00* | (2006.01) | |
| *H01L 23/538* | (2006.01) | |
| *H01L 21/50* | (2006.01) | |
| *H01L 25/065* | (2006.01) | |
| *H01L 25/11* | (2006.01) | |
| *H01L 25/10* | (2006.01) | |
| *H01L 25/16* | (2006.01) | |
| *H01L 25/04* | (2014.01) | |
| *H01L 25/07* | (2006.01) | |
| *H01L 25/075* | (2006.01) | |

(52) U.S. Cl.
CPC .... *H01L 23/49822* (2013.01); *H01L 23/5389* (2013.01); *H01L 24/19* (2013.01); *H01L 24/96* (2013.01); *H01L 24/97* (2013.01); *H01L 25/03* (2013.01); *H01L 25/50* (2013.01); *H01L 23/538* (2013.01); *H01L 23/5386* (2013.01); *H01L 24/73* (2013.01); *H01L 25/043* (2013.01); *H01L 25/0657* (2013.01); *H01L 25/074* (2013.01); *H01L 25/0756* (2013.01); *H01L 25/10* (2013.01); *H01L 25/117* (2013.01); *H01L 25/162* (2013.01); *H01L 2224/04105* (2013.01); *H01L 2224/12105* (2013.01); *H01L 2224/32145* (2013.01); *H01L 2224/32225* (2013.01); *H01L 2224/48091* (2013.01); *H01L 2224/48227* (2013.01); *H01L 2224/73265* (2013.01); *H01L 2224/73267* (2013.01); *H01L 2224/80001* (2013.01); *H01L 2224/92244* (2013.01); *H01L 2224/97* (2013.01); *H01L 2225/0651* (2013.01); *H01L 2225/06568* (2013.01); *H01L 2924/00012* (2013.01); *H01L 2924/12042* (2013.01); *H01L 2924/15311* (2013.01); *H01L 2924/181* (2013.01)

(56) References Cited

U.S. PATENT DOCUMENTS

| | | | |
|---|---|---|---|
| 6,326,700 B1 | 12/2001 | Bai et al. | |
| 6,462,414 B1 | 10/2002 | Anderson | |
| 6,558,848 B1 | 5/2003 | Kobayashi et al. | |
| 6,861,761 B2* | 3/2005 | Yang | H01L 23/3128 257/737 |
| 7,084,513 B2 | 8/2006 | Matsuki et al. | |
| 7,262,082 B1 | 8/2007 | Lin et al. | |
| 7,364,945 B2* | 4/2008 | Shim | H01L 23/3135 438/109 |
| 7,435,619 B2 | 10/2008 | Shim et al. | |
| 7,453,148 B2* | 11/2008 | Yang | H01L 23/5389 257/734 |
| 7,456,495 B2* | 11/2008 | Pohl | H01L 23/04 257/686 |
| 7,659,609 B2* | 2/2010 | Ha | H01L 25/03 257/686 |
| 7,767,496 B2* | 8/2010 | Shim | H01L 21/568 257/E21.503 |
| 7,919,850 B2* | 4/2011 | Trasporto | H01L 23/3107 257/666 |
| 7,960,827 B1 | 6/2011 | Miller, Jr. et al. | |
| 8,035,213 B2 | 10/2011 | Lee et al. | |
| 8,039,303 B2* | 10/2011 | Shim | H01L 21/568 438/107 |
| 8,283,209 B2* | 10/2012 | Camacho | H01L 21/4832 257/786 |
| 8,343,809 B2* | 1/2013 | Lin | H01L 21/563 257/E21.502 |
| 8,368,222 B2 | 2/2013 | Okuyama | |
| 8,405,213 B2* | 3/2013 | Chen | H01L 25/16 257/738 |
| 8,436,462 B2* | 5/2013 | Kim | H01L 25/105 257/693 |
| 8,456,002 B2* | 6/2013 | Lin | H01L 21/568 257/734 |
| 8,466,567 B2 | 6/2013 | Choi et al. | |
| 8,508,954 B2 | 8/2013 | Kwon et al. | |
| 8,541,872 B2* | 9/2013 | Cho | H01L 23/3128 257/685 |
| 8,552,556 B1 | 10/2013 | Kim et al. | |
| 8,643,163 B2 | 2/2014 | Shim et al. | |
| 8,736,065 B2 | 5/2014 | Gonzalez et al. | |
| 8,810,024 B2 | 8/2014 | Lin et al. | |
| 8,823,180 B2 | 9/2014 | Wang et al. | |
| 8,884,418 B2* | 11/2014 | Camacho | H01L 21/4832 257/686 |
| 8,884,422 B2 | 11/2014 | Goh et al. | |
| 8,901,724 B2 | 12/2014 | Guzek et al. | |
| 8,901,727 B2* | 12/2014 | Kang | H01L 21/563 257/686 |
| 9,385,006 B2* | 7/2016 | Lin | H01L 23/3121 |
| 9,412,661 B2* | 8/2016 | Lu | H01L 21/561 |
| 9,431,367 B2* | 8/2016 | Lin | H01L 23/3128 |
| 9,735,113 B2* | 8/2017 | Chi | H01L 21/4846 |
| 9,985,005 B2* | 5/2018 | Meyer | H01L 23/31 |
| 2004/0061213 A1* | 4/2004 | Karnezos | H01L 23/3128 257/686 |
| 2004/0178499 A1 | 9/2004 | Mistry et al. | |
| 2005/0012195 A1 | 1/2005 | Go et al. | |
| 2007/0063332 A1 | 3/2007 | Go et al. | |
| 2007/0216005 A1 | 9/2007 | Yim et al. | |
| 2008/0197173 A1 | 8/2008 | Kitae et al. | |
| 2009/0014858 A1 | 1/2009 | Boon et al. | |
| 2009/0152700 A1 | 6/2009 | Kuan et al. | |
| 2009/0166835 A1 | 7/2009 | Yang et al. | |
| 2009/0250822 A1 | 10/2009 | Chen et al. | |
| 2010/0012325 A1 | 1/2010 | Friedemann | |
| 2010/0032822 A1 | 2/2010 | Liao et al. | |
| 2010/0133704 A1 | 6/2010 | Marimuthu et al. | |
| 2010/0140779 A1 | 6/2010 | Lin et al. | |
| 2010/0213600 A1 | 8/2010 | Lau et al. | |
| 2010/0283085 A1 | 11/2010 | Bemanian et al. | |
| 2011/0047906 A1 | 3/2011 | Fitzpatrick | |
| 2011/0068427 A1 | 3/2011 | Paek et al. | |
| 2011/0147906 A1 | 6/2011 | Yang et al. | |
| 2011/0215464 A1* | 9/2011 | Guzek | H01L 21/568 257/737 |
| 2011/0233755 A1 | 9/2011 | Kim et al. | |
| 2011/0278707 A1 | 11/2011 | Chi et al. | |
| 2011/0285007 A1* | 11/2011 | Chi | H01L 21/4846 257/686 |
| 2011/0291889 A1 | 12/2011 | Mayo | |
| 2011/0298119 A1 | 12/2011 | Cho et al. | |
| 2012/0181673 A1 | 7/2012 | Pagaila et al. | |
| 2013/0210198 A1 | 8/2013 | Lin | |
| 2013/0292828 A1 | 11/2013 | Kwon et al. | |
| 2014/0054760 A1 | 2/2014 | Yu et al. | |
| 2014/0077369 A1 | 3/2014 | Liang et al. | |
| 2014/0159233 A1 | 6/2014 | Lin et al. | |
| 2014/0248742 A1 | 9/2014 | Gonzalez et al. | |
| 2014/0264930 A1* | 9/2014 | Yu | H01L 24/19 257/774 |
| 2017/0229436 A1 | 8/2017 | Yu et al. | |
| 2018/0040578 A1 | 2/2018 | Yu et al. | |

FOREIGN PATENT DOCUMENTS

| | | |
|---|---|---|
| TW | 201131735 A | 9/2011 |
| TW | 201236128 A | 9/2012 |
| TW | 201246499 A | 11/2012 |
| WO | 2005057652 A2 | 6/2005 |

OTHER PUBLICATIONS

Kumar, A., et al., "Wafer level embedding technology for 3D wafer level embedded package," 59th Electronic Components and Tech- (56) References Cited

OTHER PUBLICATIONS nology Conference (ECTC 2009). May 26-29, 2009, pp. 1289-1296. doi: 10.1109/ECTC.2009.5074177.

Li, Z., et al., "Design, processing and reliability characterizations of a 3D-WLCSP packaged component," 59th Electronic Components and Technology Conference (ECTC 2009). May 26-29, 2009, pp. 972-979. doi: 10.1109/ECTC.2009.5074131.

Motohashi, N., et al., "SMAFTI package with planarized multilayer interconnects," 59th Electronic Components and Technology Conference (ECTC 2009). May 26-29, 2009, pp. 599-606. doi: 10.1109/ECTC.2009.5074074.

\* cited by examiner

Figure 1

1. Adhesive layer coating

Figure 2a

2. Chip 1 placement

Figure 2b

3. Chip 2 placement

Figure 2c

4. Molding

POP DEVICE

PRIORITY CLAIM

This application is a division of U.S. patent application Ser. No. 13/753,204, filed Jan. 29, 2013, which is incorporated herein by reference in its entirety.

BACKGROUND

Electronics can be divided into a simple hierarchy consisting of devices such as integrated circuit (IC) chips, packages, printed circuit boards (PCB), and a system. The package is the interface between an electronic device, such as a computer chip, and a PCB. The devices are made from semiconductor materials, such as silicon. The IC chips can be assembled into a package, such as a quad flat pack (QFP), a pin grid array (PGA), or a ball grid array (BGA), for example using wire bonding (WB), tape automated bonding (TAB), or flip chip (FC) bumping assembly techniques. A packaged device is attached either directly to a printed wiring board or to another type of substrate, which is defined as a second level of packaging.

In BGA packaging technology, a semiconductor or IC chip is mounted on a front surface of a substrate, and a plurality of conductive elements such as solder balls are arranged in a matrix array, customarily referred to as ball grid array, on a back surface of the substrate. The ball grid array allows the semiconductor package to be bonded and electrically connected to an external PCB or other electronic devices. The BGA package may be employed in a memory component such as Dynamic Random Access Memory (DRAM) and other memory devices.

Package-on-Package (PoP) is an integrated circuit packaging technique to allow vertically combining, for example, discrete logic and memory BGA packages. Two or more packages are installed on top of one another, e.g. stacked, with a standard interface to route signals between them. This allows higher density, for example in the mobile telephone/smartphone market.

BRIEF DESCRIPTION OF THE DRAWINGS

For a more complete understanding of the present embodiments, and the advantages thereof, reference is now made to the following descriptions taken in conjunction with the accompanying drawings, in which.

DETAILED DESCRIPTION

The making and using of the present embodiments are discussed in detail below. It should be appreciated, however, that the present disclosure provides many applicable inventive concepts that can be embodied in a wide variety of specific contexts. The specific embodiments discussed are merely illustrative of specific ways to make and use the disclosed subject matter, and do not limit the scope of the different embodiments.

Described herein are embodiments of a PoP device with a three-dimensional (3D) fan-out structure and a method for forming the PoP device. For example, the PoP device with the 3D fan-out structure may be a memory device or component. The PoP device may comprise a chip package, such as a PoP die and an embedded chip both encapsulated in a molding compound, a BGA, and a redistribution layer (RDL) for coupling the encapsulated PoP die and embedded chip to the BGA to achieve a 3D fan-out structure. The embedded chip may be bonded to a surface of the PoP die using an adhesive layer or a thermal interface material (TIM).

The RDL may allow electrical coupling between the BGA and interconnects of the encapsulated PoP die and embedded chip, thus achieving a fan-out structure without using or forming through vias, such as Through-Silicon vias (TSVs) or Through-Mold vias (TMVs). The RDL can be used for interconnecting the BGA and the encapsulated PoP die and embedded chip instead of a laminate interconnection layer, which is typically formed with TSVs or other interconnect structures to electrically couple a die or package to a BGA. Since a laminate interconnection layer is typically thicker than a RDL, replacing a laminate interconnection layer with a RDL reduces the vertical dimension of the device, i.e., the thickness of the PoP device, which may be beneficial and more suitable for compact electronic devices. Additionally, using a RDL instead of a laminate interconnection layer removes the need for forming vias (e.g., TSVs) and/or other interconnect structures to couple the BGA to the embedded chip and the chip package, which may simplify and reduce cost of device manufacture.

Embodiments are described herein with respect to a specific context, namely a PoP die, an embedded chip, a RDL, and a BGA that form together a PoP device with a 3D fan-out structure. Other embodiments may also be applied, such as for other fan-out structures where multiple layers of IC chips or packages are stacked vertically and then coupled through a RDL to a BGA or similar interconnect packages.

Throughout the various figures and discussion, like reference numbers refer to like components. Also, although singular components may be depicted throughout some of the figures, this is for simplicity of illustration and ease of discussion. A person having ordinary skill in the art will readily appreciate that such discussion and depiction can be and usually is applicable for many components within a structure.

Figure 1:
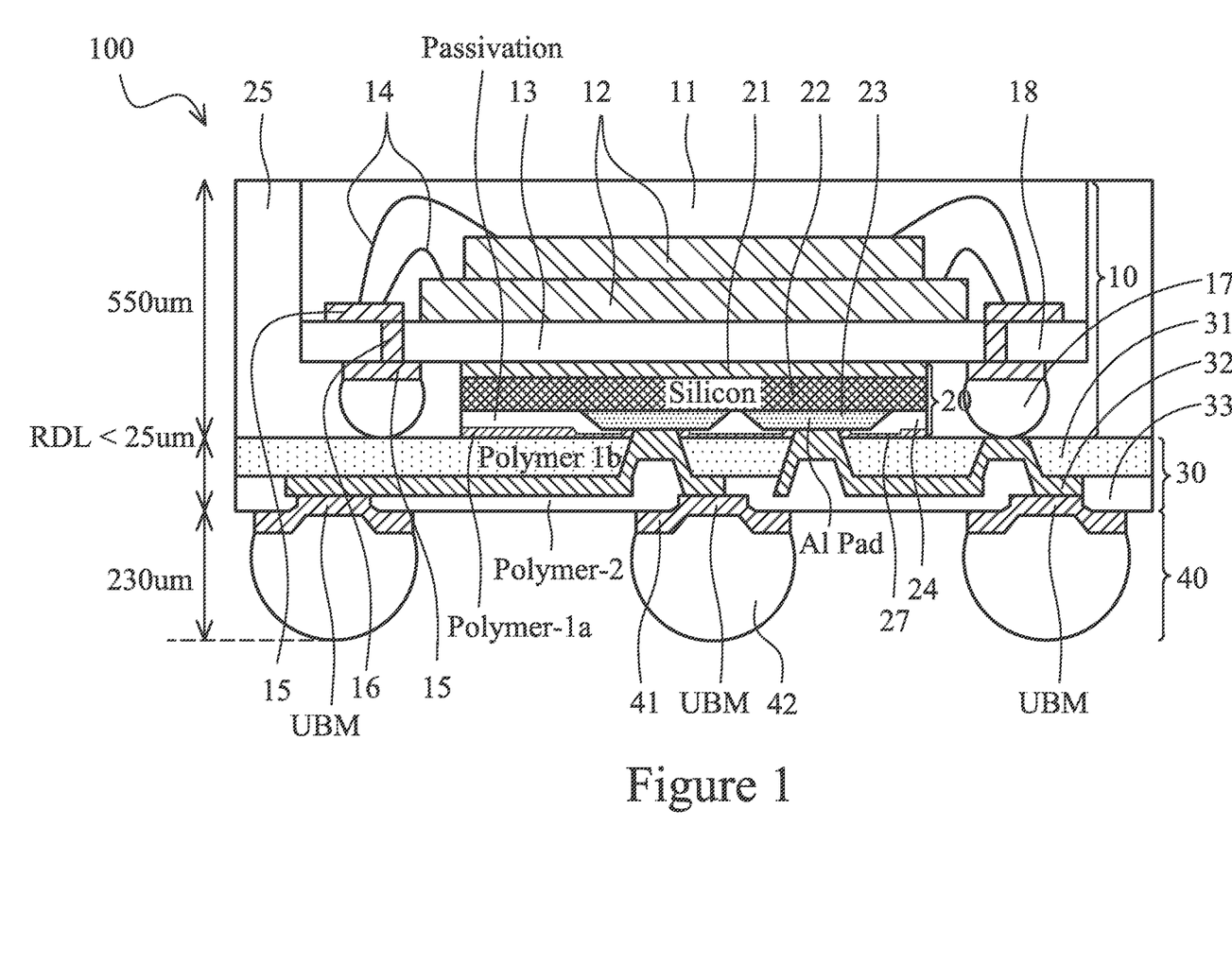
FIG. 1 illustrates a cross section of a PoP device with a 3D fan-out structure according to an embodiment.

FIG. 1 illustrates a cross section of an embodiment of a PoP device 100 having a 3D fan-out structure, according to an embodiment. For example, the PoP device 100 may correspond to a memory device or component, such as a DRAM device or component. The PoP device 100 may comprise a PoP die 10 (or other chip package), an embedded chip 20 coupled to the PoP die 10, a molding compound that encapsulates the PoP die 10 and the embedded chip 20, a RDL 30 coupled to the encapsulated PoP die 10 and embedded chip 20, and a BGA 40 coupled to the RDL 30. The components or layers, above, of the PoP device 100 may be positioned and stacked with respect to one another as shown in FIG. 1.

The PoP die 10 may be formed and obtained using any suitable semiconductor fabrication processes. The PoP die 10 may comprise a plurality of stacked chips 12, which may have different dimensions. The stacked chips 12 may comprise one or more semiconductor layers (e.g., silicon and/or other semiconductor materials), one or more conductive layers, one or more dielectric layers, or combinations thereof. The stacked chips 12 may be encapsulated by a second molding compound 11 and positioned on a substrate 18. For example, the PoP die 10 may include two silicon chips of different dimensions stacked on top of each other on the substrate 18 and surrounded from the top and sides by the second molding compound 11. The two stacked chips 12 and the second molding compound 11 are supported by the substrate 18. The substrate 18 may be, for example, a silicon substrate (such as a silicon chip), a silicon or glass interposer, a printed circuit board (PCB), an organic laminate substrate, or the like.

The PoP die 10 may also comprise a plurality of pads 15, which may be positioned on both sides of the substrate 18 and connected across the substrate 18 through vias 16 (e.g., through vias). The pads 15 on one side of the substrate (on the side of the stacked chips 12) may be connected to the stacked chips 12 through bonding wires 14. The pads 15 on the other side of the substrate 18 (opposite to the stacked chips 12) may be bonded to a plurality of interconnects 17, for instance in the form of solder balls or spheres (e.g., C4 bumps) or, in other embodiments, other suitable bonding structures. The bonding wires 14, pads 15, and vias 16 provide electrical coupling between the stacked chips 12 and the interconnects 17.

The embedded chip 20 may be formed on a surface of the PoP die 10 and may comprise a silicon chip 22 (or other semiconductor chip) and a bonding layer 21 that bonds the silicon chip 22 to the substrate 18 of the PoP die 10. In an embodiment, the bonding layer 21 may be an adhesive layer formed of a glue or a lamination layer formed of a foil. In another embodiment, a TIM may be used as the bonding layer 21 to bond the silicon chip 22 to the substrate 18. The TIM may make contact with the stacked chips 12 using through vias that may be formed in the substrate 18 to provide a thermally conductive connection between the silicon chip 22 and the stacked chips 12. The TIM may be a thermal paste, such as a silicone rubber with thermally-conductive fillers such as aluminum oxide and/or boron nitride.

The embedded chip 20 may also comprise one or more metallic and dielectric layers formed between the silicon chip 22 and the RDL 30. The layers may provide a suitable electrical connection between the silicon chip 22 and the RDL 30 and include a plurality of pads 23 (e.g., aluminum or other suitable metal pads), a passivation (dielectric) layer 24, and a first polymer layer 27, which may be arranged as shown in FIG. 1. The passivation layer 24 and the first polymer layer 27 may be patterned structures (discontinuous across the surface) to allow proper coupling between the pads 15 and the RDL 30.

The RDL 30 may comprise a second polymer layer 31 and a conductive layer 32. The second polymer layer 31 may be a second polymer layer that is formed or deposited onto the first polymer layer 27. The conductive layer 32 may be a metal layer, for example an aluminum, copper, titanium, polysilicon, or gold layer. The RDL 30 may also comprise a third polymer layer 33 formed or deposited onto the conductive layer 32. As described above, the function of the RDL 30 is to provide electrical coupling between the embedded chip 20 and the BGA 40 without the formation of through vias (e.g., TSVs or TMVs). The second polymer layer 31, the conductive layer 32, and the third polymer layer 33 may be patterned to allow proper coupling between the pads 15 and the BGA 40, i.e., through contact with interconnects 17 and the conductive layer 32 that provide the electrical coupling between the pads 15 and the BGA 40. In an embodiment, a plurality of Under-Bump Metallization (UBM) elements 41 may be formed on the surface of the RDL 30 to bond the BGA 40 to the embedded chip 20. The UBM elements 41 may be coupled to surface portions of the third polymer layer 33 and to the conductive layer 32. The BGA 40 includes a plurality of conductive elements 42, such as conductive spheres or micro bumps, which are arranged in an array (or other orderly pattern) and placed in contact with the UBM elements 41.

As described above, the RDL 30 is used to couple the PoP die 10 and the embedded chip 20 to the BGA. As such, the RDL 30 can replace a laminate interconnection layer, which is typically used to bond and electrically couple a chip package to a BGA. Using the RDL 30 instead substantially reduces the overall thickness of the PoP device 100 (in the vertical or top-bottom direction of FIG. 1). For example, the molding compound 25 that encapsulates the PoP die 10 and the embedded chip 20 may have a thickness equal or close to 550 micrometers (µm), the BGA 40 may have a thickness equal or close to 240 µm, and the RDL 30 may have a thickness equal or close to about 25 µm, while a typical thickness of a laminate interconnection layer is around 500 µm or more. Thus, using the RDL 30 reduces the overall thickness of the 3D fan-out structure from about 1,400 µm to about 800 µm, i.e., a reduction of more than 40 percent. The reduced thickness of the structure enables better packaging and integration for smaller devices, such as in smartphones, computer tablets, laptops, or other consumer devices. Further, the RDL 30 provides the electrical coupling between the components of the 3D fan-out structure (the PoP device 100) without the formation of through vias, which facilitates fabrication and reduces cost.

Figure 2A:
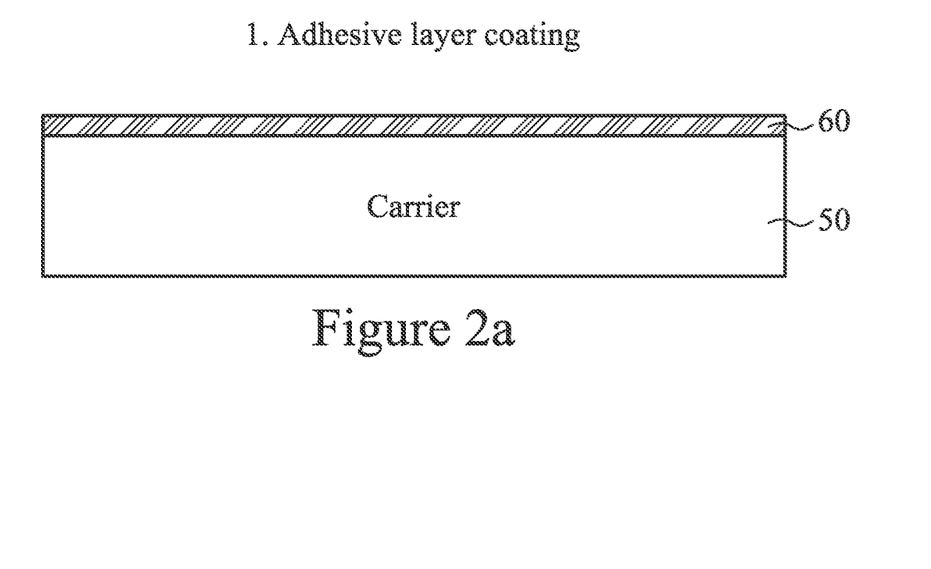
FIGS. 2a through 2h illustrate a process of forming the PoP device of FIG. 1 according to an embodiment.

FIGS. 2a through 2h illustrate a process to form the PoP device 100 according to an embodiment. Although this embodiment is discussed with steps performed in a particular order, steps may be performed in any logical order. FIG. 2a illustrates an adhesive layer coating step, where an adhesive layer 60 may be disposed, for example laminated, on the carriers 50. The adhesive layer 60 may be formed of a glue or may be a lamination layer formed of a foil. The carrier 50 may be any suitable substrate that provides (during intermediary steps of the fabrication process) mechanical support for carrying a plurality of stacked layers of the 3D fan-out structure. The carrier 50 may be, for example, a silicon substrate, a silicon or glass interposer, a PCB, an organic laminate substrate, or the like.

Figure 2B:
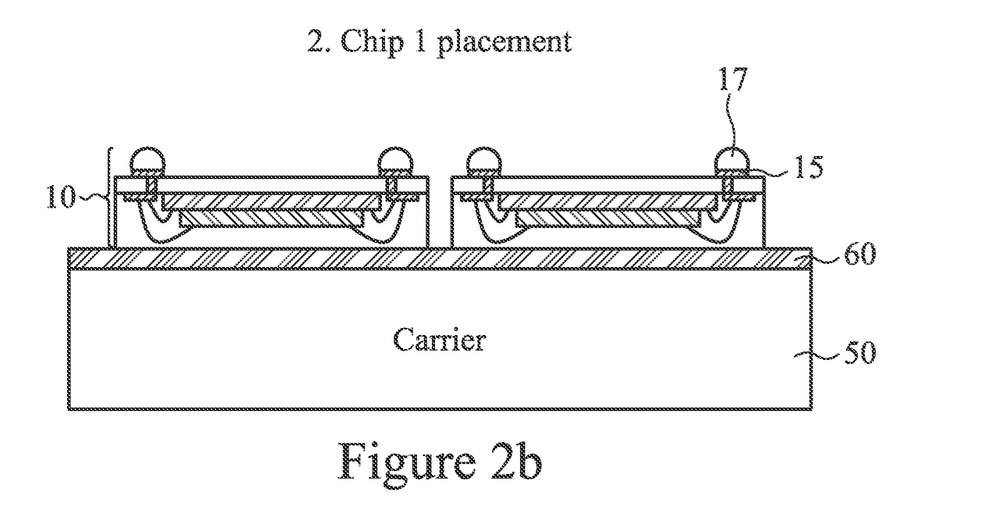

FIG. 2b illustrates a first chip placement step, where a plurality of PoP dies 10, e.g., an array of PoP dies 10, may be placed on the adhesive layer 60. In other embodiments, other types of chip packages may be placed on the adhesive layer 60. The PoP dies 10 may be formed on the adhesive layer 60 or placed using any suitable method of placing the PoP dies 10 onto the adhesive layer 60 and integrating the PoP dies 10 into a manufacturing process flow. In one embodiment, the PoP dies 10 (without the interconnects 17) may be attached to a transfer layer or substrate (not shown). The transfer layer may be utilized to place the PoP dies 10 over the adhesive layer 60, e.g., using a flip-chip process. The placement of the PoP dies 10 may be performed by flipping the transfer layer (with the PoP dies 10 attached) and positioning the PoP dies 10 properly onto the adhesive layer 50. The transfer layer may be removed after the PoP dies 10 have been flipped and placed on the adhesive layer 50, for instance using a stripping or etching process to remove the material of the transfer layer from PoP dies 10. The interconnects 17 may then be placed with the pads 15 on the surface of the PoP dies 10.

Figure 2C:
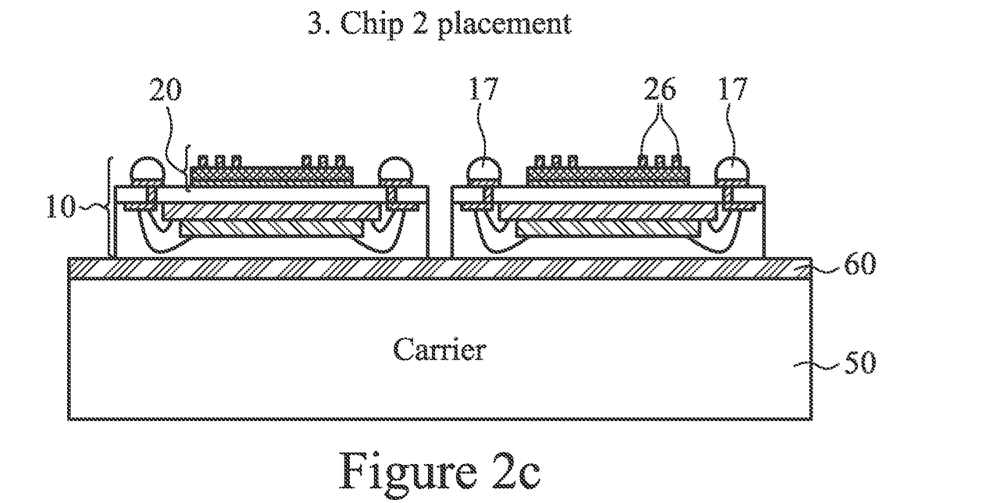

FIG. 2c illustrates a second chip placement step, where a plurality of embedded chips 20, e.g., an array of embedded chips 20, may be aligned with and placed onto the PoP dies 10. The embedded chips 20 may be formed and aligned appropriately on the PoP dies 10. As shown in FIG. 2c, each of the embedded chips 20 may be aligned and positioned around the center of the exposed surface of a PoP die 10, between the interconnects 17 (e.g., two solder balls) on the opposite sides of the PoP die 10. Similar to the placement step of the PoP dies 10, the embedded chips 20 may be formed on the PoP die 10 or placed using any suitable method of placing the embedded chips 20 onto the PoP die 10 and integrating the embedded chips 20 into a manufacturing process flow. In one embodiment, the embedded chips 20 (without the connector elements 26) may be attached to a transfer layer or substrate (not shown). The transfer layer may be utilized to place the embedded chips 20 over the PoP dies 10, e.g., using a flip-chip process. The placement of the embedded chips 20 may be performed by flipping the transfer layer (with the embedded chips 20 attached) and positioning the embedded chips 20 properly onto the PoP dies 10. The transfer layer may be removed after the embedded chips 20 have been flipped and placed on the PoP dies 10, for instance using a stripping or etching process to remove the material of the transfer layer from embedded chips 20. The connector elements 26 may then be placed on the surface of the embedded chips 20. The connector elements 26 in FIG. 2c may correspond to the pads 23 in FIG. 1 or may be any other suitable interconnect structures, such as bumps, bond pads, wire bonds, or the like.

Figure 2D:
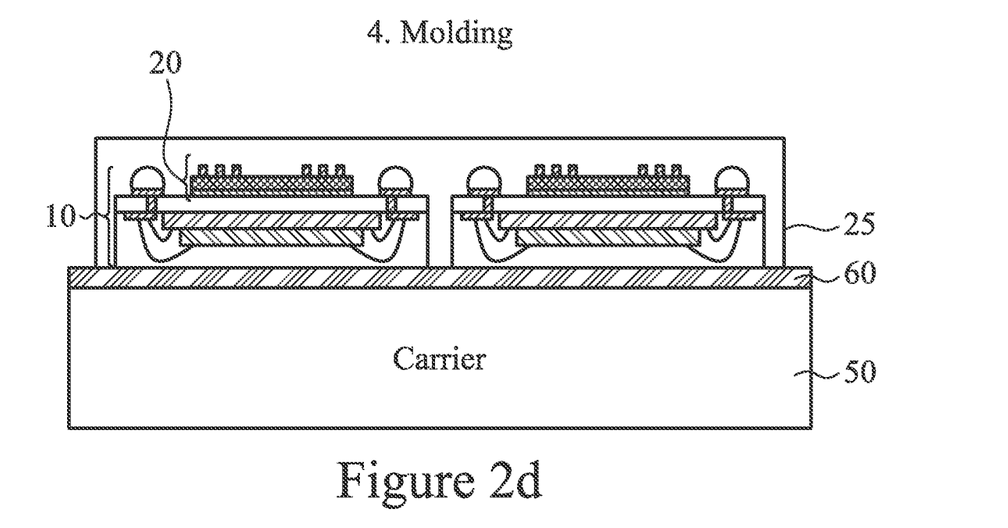

FIG. 2d illustrates a molding step, where the molding compound 25 may be formed to encapsulate the PoP dies 10 and the embedded chips 20 on the adhesive layer 60. The molding compound 25 may comprise a polymer, a molding underfill, the like, or a combination there of. The molding compound 25 may be formed by wafer level molding to envelope the PoP dies 10 and the embedded chips 20 (from the top and the sides) on the adhesive layer 60.

Figure 2E:
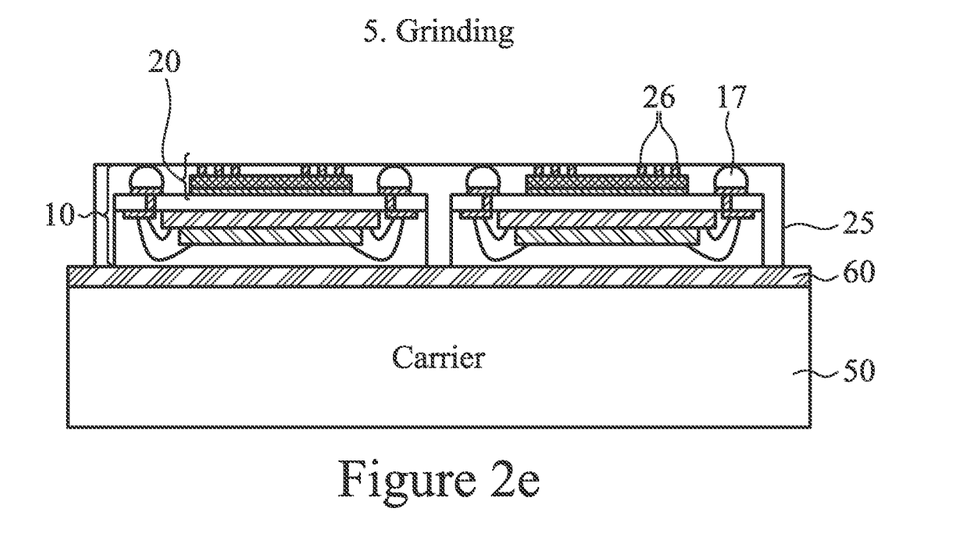

FIG. 2e illustrates a grinding step, where the molding compound 25 may be partially grinded or otherwise removed (e.g., etched) to expose connector elements 26 at the top surface of the embedded chips 20 and at least top portions of the interconnects 17 (e.g., solder balls) of the PoP dies 10. The thickness of the molding compound 25 may be reduced, for example, by a grinding or polishing process to expose the connector elements 26 and the interconnects 17.

Figure 2F:
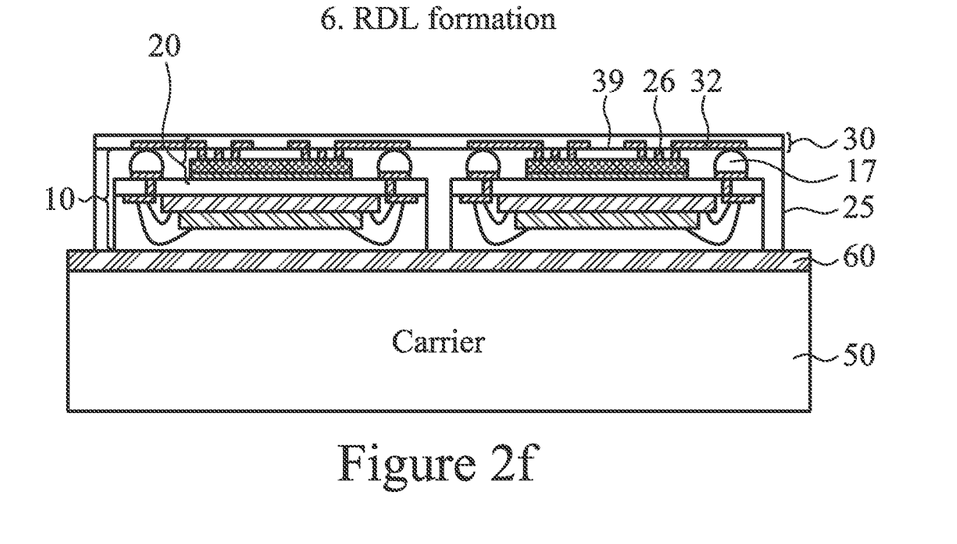

FIG. 2f illustrates a RDL formation step, where the RDL 30 may be formed on top of the thinned (or polished) molding compound 25, the connector elements 26, and the solder balls 17. The conductive layer 32 of the RDL 30 may be formed (e.g., deposited) and patterned (e.g., using lithography processes or steps) to be in contact with exposed top surface portions of connector elements 26 and the interconnects 17, as shown in FIG. 2f. A polymer layer 39 of the RDL 30 may be formed to extend along exposed top surfaces of the molding compound 25, the conductive layer 32, the connector elements 26, and the interconnects 17. The polymer layer 39 in FIG. 2f may correspond to the second polymer layer 31 and the third polymer layer 33 in FIG. 1.

Figure 2G:
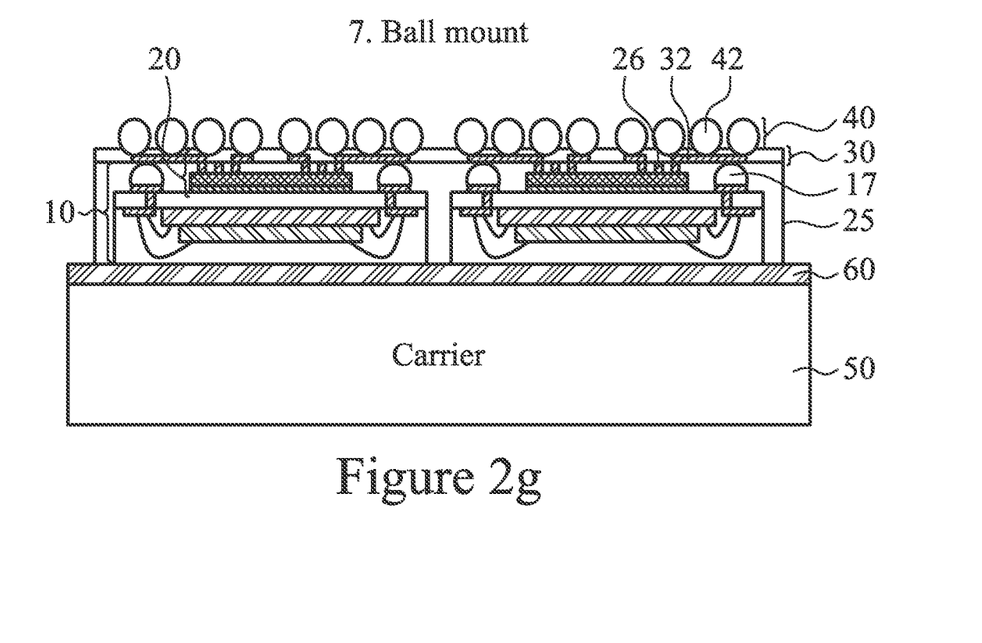

FIG. 2g illustrates a ball mount step, where the BGA 40 may be bonded to the RDL 30. The conductive elements 42 of the BGA 40 may be placed into contact with the conductive layer 32 of the RDL 30. In an embodiment, the BGA 40 may be coupled to the RDL 30 using a stencil print process. The conductive elements 42 of the BGA 40 may be coupled to UBM elements (not shown) in the RDL 30 that are formed on the conductive layer 32. The conductive elements 42 may be C4 bumps, micro bumps, or the like and may comprise a material such as tin, silver, lead-free tin, copper, the like, or a combination thereof. In another embodiment, the BGA 40 may be coupled to RDL 30 by another chip bonding process that does not utilize UBM elements in the RDL 30. The conductive layer 32 of the RDL 30 provides electrical coupling between the conductive elements 42 of the BGA 40 (on one side) and both the connector elements 26 of the embedded chips 20 and the interconnects 17 of the PoP dies 10. This removes the need of using a laminate interconnection layer to bond the chip/die package to the BGA to achieve a 3D fan-out structure, and hence reduces overall structure thickness, removes the need for forming through vias, and reduces cost.

Figure 2H:
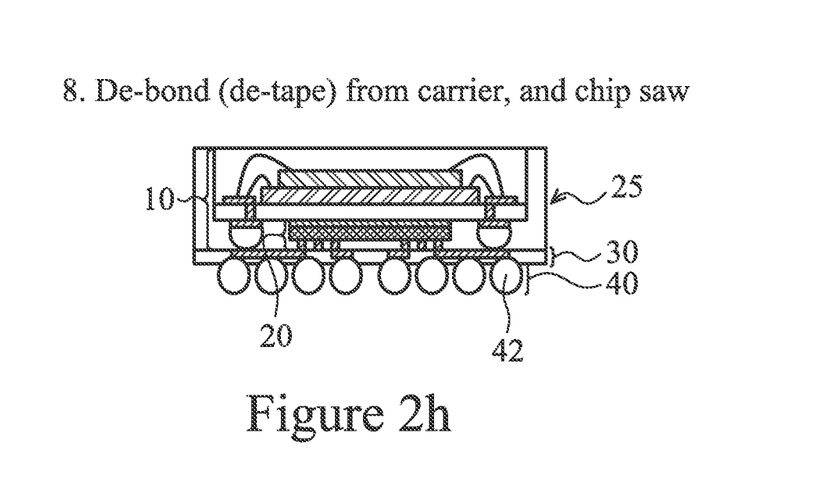

FIG. 2h illustrates removing the carrier 50 and adhesive layer 60 (not shown) and obtaining separate and individual chip/die packages. Each chip/die package may correspond to one PoP device 100 with a 3D fan-out structure, which may be, for example, to a memory chip component. To obtain a plurality of separate and similar 3D fan-out structures, the carrier 50 may be de-bonded (e.g., de-taped) from the remaining layers/components on top of the carrier 50. In an embodiment, the carrier 50 may be removed by dissolving or etching the adhesive layer 60 that bonds the carrier 50 to the packaged components/layers. When the carrier 50 is de-bonded or removed, the remaining bonded layers comprise the molding compound 25 encapsulating the PoP dies 10 and the embedded chips 20, the RDL 30, and the BGA 40.

To obtain a plurality of similar chip/die packages, a chip saw, patterned etch, laser, or the like step may then be implemented to separate the remaining bonded layers vertically along the lines between the adjacent PoP dies 10. The resulting individual chip/die packages may be flipped to obtain similar PoP devices 100 that have the 3D fan-out structure. The resulting PoP devices 100 may be separately sold, shipped, used, and/or integrated in devices or other packages. The PoP devices 100 may be integrated in devices or other packages, where the BGA 40 at the bottom is used to electrically couple components of the PoP die 10 and the embedded chip 22 to other devices or packages. For instance, a PoP device 100 (as shown in FIG. 2h) may be placed on top of another chip package or a PCB and may be electrically coupled to multiple components through the conductive elements 42 of the BGA 40.

In an embodiment, a method includes: forming an adhesive layer on a carrier substrate; adhering a first side of a chip package to the adhesive layer; forming a first conductive connector adjacent a second side of the chip package; forming a bonding layer on the second side of the chip package; coupling a chip to the bonding layer, the chip having a connecting element; encapsulating the chip, the connecting element, and the first conductive connector with a first molding compound; grinding the first molding compound to expose portions of the connecting element and the first conductive connector; forming a redistribution structure over the first molding compound, the redistribution structure electrically connected to the exposed portions of the connecting element and the first conductive connector; and forming a second conductive connector on and electrically connected to the redistribution structure.

In some embodiments of the method, the chip package includes: a first substrate having a through vias; a die on the first substrate; and a second molding compound encapsulating the die. In some embodiments of the method, after encapsulating the chip, the first molding compound is disposed on sidewalls of the second molding compound and the chip. In some embodiments of the method, the bonding layer is a thermal interface material (TIM), the through via physically contacting the bonding layer and the die to form a thermally conductive connection between the chip and the die. In some embodiments of the method, forming the redistribution structure includes: forming a first polymer layer on the first molding compound and the chip; forming a first opening in the first polymer layer, the first opening exposing the connecting element of the chip; forming a first conductive line on the first polymer layer and in the first opening, the first conductive line contacting the connecting element of the chip; and forming a second polymer layer on the first conductive line and the first polymer layer. In some embodiments of the method, forming the redistribution structure further includes: forming a second opening in the first polymer layer, the second opening exposing the first conductive connector; and forming a second conductive line on the first polymer layer and in the second opening, the second conductive line contacting the first conductive connector, the second polymer layer further formed on the second conductive line. In some embodiments of the method, a first surface of the first polymer layer contacts the first molding compound and a second surface of the first polymer layer contacts the second polymer layer, the first conductive line extending from the first surface of the first polymer layer to the connecting element of the chip by a first distance, the second conductive line extending from the first surface of the first polymer layer to the first conductive connector by a second distance, the first distance being greater than the second distance. In some embodiments of the method, after the redistribution structure is formed, the chip is embedded between the chip package and the redistribution structure. In some embodiments of the method, the first conductive connector includes solder and the connecting element of the chip is free from solder.

In an embodiment, a method includes: forming a first package including: attaching a die to a first side of a substrate; and encapsulating the die with a first molding compound, edges of the first molding compound and the substrate being coterminous; forming a first conductive connector adjacent a second side of the substrate; forming a thermal interface material (TIM) on the second side of the substrate; adhering a chip to the TIM, the chip having a connecting element; encapsulating the chip, the first conductive connector, and the first molding compound with a second molding compound; grinding the second molding compound to expose the connecting element of the chip and the first conductive connector; and depositing a first polymer layer on the second molding compound, exposed portions of the connecting element, and exposed portions of the first conductive connector.

In some embodiments, the method further includes: forming a first opening in the first polymer layer exposing the connecting element; forming a second opening in the first polymer layer exposing the first conductive connector; forming a conductive line on the first polymer layer, a first portion of the conductive line extending through the first opening to contact the connecting element, a second portion of the conductive line extending through the second opening to contact the first conductive connector; and depositing a second polymer layer on the conductive line and the first polymer layer. In some embodiments of the method, the first opening has a first depth, the second opening has a second depth, and the first depth is greater than the second depth. In some embodiments of the method, the substrate has a through via extending from a first side of the substrate to a second side of the substrate, the through via forming a thermally conductive connection between the chip and the die.

In an embodiment, a method includes: placing an adhesive layer on a carrier substrate; coupling a plurality of chip packages to the adhesive layer on the carrier substrate; placing a bonding layer on the chip packages; coupling a plurality of chips to the bonding layer on the chip packages; encapsulating with a molding compound the chip packages and the chips on the carrier substrate; grinding the molding compound to expose a plurality of connecting elements of the chips and a plurality of second connecting elements of the chip packages; forming a redistribution layer (RDL) on the molding compound and the exposed connecting elements and second connecting elements; forming a ball grid array (BGA) on the RDL; and de-bonding the carrier substrate.

In some embodiments, the method further includes removing the adhesive layer. In some embodiments of the method, the chips are embedded in the chip packages between the second connecting elements of the chip packages. In some embodiments of the method, the chip packages are transferred and bonded to the adhesive layer using a transfer layer and a flip-chip process. In some embodiments of the method, the chips are transferred and bonded to the bonding layer using a transfer layer and a flip-chip process. In some embodiments, the method further includes sawing the chip packages and the chips encapsulated in the molding compound and coupled to the RDL and the BGA to obtain a plurality of PoP devices that have a three-dimensional fan-out structure. In some embodiments of the method, forming the RDL includes: forming a conductive layer on the molding compound and the exposed connecting elements and second connecting elements; patterning the conductive layer; forming a polymer layer on the patterned conductive layer; patterning the polymer layer; forming a plurality of Under-Bump Metallization (UBM) elements on the patterned conductive layer and the patterned polymer layer; and placing a plurality of conductive spheres of the BGA on the UBM elements.

Although the present embodiments and their advantages have been described in detail, it should be understood that various changes, substitutions, and alterations can be made herein without departing from the spirit and scope of the disclosure as defined by the appended claims. Moreover, the scope of the present application is not intended to be limited to the particular embodiments of the process, machine, manufacture, composition of matter, means, methods, and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:
1. A method comprising:
 forming an adhesive layer on a carrier substrate;
 adhering a first side of a chip package to the adhesive layer, the chip package comprising:
  a first substrate;
  a first through via extending through the first substrate;
  a die on the first substrate, the die physically contacting the first through via;
  a first conductive connector adjacent a second side of the chip package; and
  a second conductive connector adjacent the second side of the chip package;

after adhering the first side of the chip package to the adhesive layer, forming a bonding layer on the second side of the chip package, the bonding layer physically contacting the first through via and the first substrate, the bonding layer laterally disposed between the first conductive connector and the second conductive connector;

coupling a chip to the bonding layer, the chip having a passivation layer and a connecting element, the passivation layer covering the connecting element, wherein the bonding layer and the first through via form a thermally conductive connection between the chip and the die;

encapsulating the chip, the passivation layer, the connecting element, the first conductive connector, and the second conductive connector with a first molding compound, wherein after encapsulating the chip, the first molding compound covers the passivation layer, the first conductive connector, and the second conductive connector;

grinding the first molding compound to expose the passivation layer, a first portion of the first conductive connector, and a second portion of the second conductive connector;

forming a redistribution structure on the first molding compound, the passivation layer, the first portion of the first conductive connector, and the second portion of the second conductive connector, the redistribution structure comprising a first polymer layer, a first conductive line, and a second conductive line, wherein the first conductive line extends through the first polymer layer and the passivation layer by a first distance to contact the connecting element, wherein the second conductive line extends through the first polymer layer by a second distance to contact the first portion of the first conductive connector, the first distance being greater than the second distance, wherein the first polymer layer contacts the second portion of the second conductive connector and electrically isolates the second conductive connector from conductive features of the redistribution structure;

forming a third conductive connector on and electrically connected to the redistribution structure; and after the forming the redistribution structure and the third conductive connector, removing the carrier substrate and the adhesive layer from the first side of the chip package.

2. The method of claim 1, wherein the chip package further comprises:
a second molding compound encapsulating the die.

3. The method of claim 2, wherein after encapsulating the chip, the first molding compound is disposed on sidewalls of the second molding compound and the chip.

4. The method of claim 2, wherein the bonding layer is a thermal interface material (TIM).

5. The method of claim 1, wherein forming the redistribution structure comprises:
forming the first polymer layer on the first molding compound and the chip;
forming a first opening in the passivation layer and the first polymer layer, the first opening exposing the connecting element of the chip;
forming the first conductive line on the first polymer layer and in the first opening; and
forming a second polymer layer on the first conductive line and the first polymer layer.

6. The method of claim 5, wherein forming the redistribution structure further comprises:
forming a second opening in the first polymer layer, the second opening exposing the first conductive connector; and
forming the second conductive line on the first polymer layer and in the second opening, the second conductive line contacting the first conductive connector, the second polymer layer further formed on the second conductive line,
wherein forming the redistribution structure does not comprise forming openings in the first polymer layer exposing the second conductive connector.

7. The method of claim 1, wherein after the redistribution structure is formed, the chip is embedded between the chip package and the redistribution structure.

8. The method of claim 1, wherein the first conductive connector and the second conductive connector each comprise solder and the connecting element of the chip is free from solder.

9. The method of claim 1, wherein the chip package further comprises:
a second through via extending through the first substrate, the second through via electrically connecting the die to the first conductive connector, the second through via electrically isolated from the first through via.

10. A method comprising:
forming a first package comprising:
forming a first through via extending from a first side of a substrate to a second side of the substrate;
attaching a die to the first side of the substrate, the die physically contacting the first through via;
encapsulating the die with a first molding compound, edges of the first molding compound and the substrate being coterminous;
forming a first conductive connector adjacent the second side of the substrate; and
forming a second conductive connector adjacent the second side of the substrate;
after forming the first package, attaching the first package to a carrier substrate, the first side of the substrate facing the carrier substrate;
after attaching the first package to the carrier substrate, forming a thermal interface material (TIM) on the second side of the substrate, the TIM physically contacting the first through via;
adhering a chip to the TIM, the chip having a connecting element and a passivation layer on the connecting element, the chip laterally disposed between the first conductive connector and the second conductive connector, wherein the first through via and the TIM form a thermally conductive connection between the chip and the die;
encapsulating the chip, the first conductive connector, the second conductive connector, and the first molding compound with a second molding compound;
grinding the second molding compound and the passivation layer to expose the passivation layer of the chip, the first conductive connector, and the second conductive connector, wherein surfaces of the second molding compound, the passivation layer, the first conductive connector, and the second conductive connector are planar after the grinding;
depositing a first polymer layer on the second molding compound, the passivation layer, exposed portions of the first conductive connector, and exposed portions of the second conductive connector;

forming a first opening in the first polymer layer and the passivation layer exposing the connecting element, wherein the first opening has a first depth extending from a surface of the first polymer layer to the connecting element;

forming a second opening in the first polymer layer exposing the first conductive connector, wherein the second opening has a second depth extending from the surface of the first polymer layer to the first conductive connector, and the first depth is greater than the second depth;

forming a conductive line on the first polymer layer, a first portion of the conductive line extending through the first opening to contact the connecting element, a second portion of the conductive line extending through the second opening to contact the first conductive connector; and depositing a second polymer layer on the conductive line and the first polymer layer, wherein the first polymer layer is disposed between and contacts the second conductive connector and the second polymer layer, and wherein no openings are formed in the first polymer layer exposing the second conductive connector.

11. The method of claim 10 further comprising:
forming a second through via extending from the first side of the substrate to the second side of the substrate, the second through via electrically connecting the die to the first conductive connector, the second through via electrically isolated from the first through via.

12. The method of claim 2, wherein adhering the first side of the chip package to the adhesive layer comprises adhering the second molding compound to the adhesive layer.

13. The method of claim 10 further comprising:
after grinding the second molding compound, removing the first package from the carrier substrate.

14. A method comprising:
placing an adhesive layer on a carrier substrate;
coupling a chip package to the adhesive layer on the carrier substrate, the chip package comprising a substrate, a first chip on a first side of the substrate, a first connecting element on a second side of the substrate, a second connecting element on the second side of the substrate, and a through via extending from the first side of the substrate to the second side of the substrate;
after coupling the chip package to the adhesive layer, placing a bonding layer on the chip package adjacent to the first connecting element and the second connecting element, the bonding layer physically contacting the through via and the second side of the substrate;
after placing the bonding layer on the chip package, coupling a die to the bonding layer, the die comprising a third connecting element, a fourth connecting element, and a passivation layer on the third connecting element and the fourth connecting element, wherein the through via and the bonding layer form a thermally conductive connection between the first chip and the die;
encapsulating with a molding compound the chip package and the die on the carrier substrate;
grinding the molding compound to expose the passivation layer, the first connecting element, and the second connecting element, wherein surfaces of the molding compound, the passivation layer, the first connecting element, and the second connecting element are planar after the grinding;

forming a first polymer layer on the planar surfaces of the molding compound, the passivation layer, the first connecting element, and the second connecting element;

forming a first opening in the first polymer layer, the first opening exposing the first connecting element, the first opening extending from a surface of the first polymer layer to the first connecting element by a first distance;

forming a second opening in the passivation layer and the first polymer layer, the second opening extending from the surface of the first polymer layer to the third connecting element by a second distance, the second distance being greater than the first distance;

forming a third opening in the passivation layer and the first polymer layer, the third opening extending from the surface of the first polymer layer to the fourth connecting element by the second distance;

forming a first conductive line on the first polymer layer, in the first opening, and in the second opening;

forming a second conductive line on the first polymer layer and in the third opening, the second conductive line extending directly over the second connecting element, the first polymer layer physically separating the second conductive line from the second connecting element;

forming a second polymer layer on the first conductive line and the first polymer layer;

forming a ball grid array (BGA) electrically connected to the first conductive line and the second conductive line; and de-bonding the carrier substrate.

15. The method of claim 14 further comprising removing the adhesive layer.

16. The method of claim 14, wherein after the coupling, the die is embedded in the chip package adjacent to the first connecting element.

17. The method of claim 14, wherein the chip package is transferred and bonded to the adhesive layer using a transfer layer and a flip-chip process.

18. The method of claim 14, wherein the die is transferred and bonded to the bonding layer using a transfer layer and a flip-chip process.

19. The method of claim 14 further comprising sawing the chip package and the die encapsulated in the molding compound to obtain a PoP device that has a three-dimensional fan-out structure.

20. The method of claim 14 further comprising:
forming a plurality of Under-Bump Metallization (UBM) elements through the second polymer layer to contact the first conductive line and the second conductive line; and
placing a plurality of conductive spheres of the BGA on the UBM elements.

21. The method of claim 14, wherein the chip package has a first side and a second side, the first side coupled to the adhesive layer, the molding compound fully electrically isolating the second side of the chip package.

\* \* \* \* \*